US011264982B2

United States Patent
Terenzi et al.

(10) Patent No.: US 11,264,982 B2
(45) Date of Patent: Mar. 1, 2022

(54) HIGH VOLTAGE DRIVING ELECTRONIC CIRCUIT ARRANGEMENT HAVING A SHORT CIRCUIT PROTECTION, CORRESPONDING APPARATUS AND METHOD

(71) Applicant: STMicroelectronics S.r.l., Agrate Brianza (IT)

(72) Inventors: Marco Terenzi, San Martino Siccomario (IT); Davide Ugo Ghisu, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 762 days.

(21) Appl. No.: 15/944,377

(22) Filed: Apr. 3, 2018

(65) Prior Publication Data
US 2018/0302080 A1  Oct. 18, 2018

(30) Foreign Application Priority Data
Apr. 14, 2017  (IT) ................... 102017000042107

(51) Int. Cl.
*H03K 17/082* (2006.01)
*H03K 19/003* (2006.01)
*B06B 1/02* (2006.01)

(52) U.S. Cl.
CPC ....... *H03K 17/0822* (2013.01); *B06B 1/0253* (2013.01); *H03K 19/00315* (2013.01); *B06B 2201/76* (2013.01)

(58) Field of Classification Search
CPC . H02H 3/08; H02H 3/023; B06B 3/02; B06B 2201/76; B06B 2201/20;
(Continued)

(56) References Cited

U.S. PATENT DOCUMENTS 3,109,106 A * 10/1963 Jarosik ................. H03K 5/02
  327/170
5,256,914 A * 10/1993 Boomer ........... H03K 19/09429
  326/26
(Continued)

FOREIGN PATENT DOCUMENTS

CN  101087105 A  12/2007
CN  101165983 A   4/2008
(Continued)

OTHER PUBLICATIONS

John et al., "Fast-Clamped Short-Circuit Protection of IGBT's," *IEEE Transactions on Industry Applications* 35(2):477-486, Mar./Apr. 1999.
(Continued)

*Primary Examiner* — Kevin J Comber
*Assistant Examiner* — Nusrat Quddus
(74) *Attorney, Agent, or Firm* — Seed IP Law Group LLP

(57) ABSTRACT

A high voltage driving circuit for driving a load receives a low voltage input signal and generates a high voltage output signal. A short circuit protection circuit including a first electronic switch operated by the low voltage input signal and a second electronic switch operated by a low voltage signal obtained by a voltage division of the output high voltage signal. The first electronic switch causing a first pull-up current to be sent to a capacitive element whose voltage controls an input of a threshold comparator. A second electronic switch causes a second pull-down current to be drawn from the capacitive element whose voltage controls the input of the threshold comparator. A short circuit detection signal is generated at an output of said threshold comparator, indicating a short circuit and capable of inhibiting operation of the driving circuit.

18 Claims, 7 Drawing Sheets

(58) Field of Classification Search
CPC ... B06B 1/0253; B06B 1/0246; B06B 1/0261; B06B 1/0215; B06B 1/023; B06B 1/0238; H02M 1/32; H02M 7/08; H02M 7/155; H02M 7/17; H02M 7/217; H02M 7/538; H02M 7/5383; H02M 7/5381; H02M 7/539; H02M 7/5395; H02M 2003/078; H02M 2001/0009; H02M 2001/0025; H02M 2001/081; H02M 2001/322; H02M 2001/0003; H02M 2001/0032; H02M 2001/0038; H02M 2001/0045; H02M 2001/0035; H02M 2001/0054; G05F 1/56; G05F 1/561; G05F 1/562; G05F 1/565; G05F 1/569; G05F 1/571; G05F 1/573; G05F 1/5735; G05F 1/575; G05F 1/468; G05F 1/452; G05F 3/26; G05F 3/262; G05F 3/267; G05F 3/30; G05F 3/08; G05F 3/16; G05F 3/24; G05F 3/242; G05F 3/247; H03K 12/00; H03K 7/02; H03K 5/22; H03K 5/2436; H03K 5/2445; H03K 5/2477; H03K 5/2481; H03K 4/023; H03K 4/085; H03K 4/48; H03K 4/50; H03K 4/92; H03K 4/56; H03K 4/502; H03K 4/62; H03K 4/625; H03K 4/69; H03K 4/693; H03K 4/71; H03K 4/725; H03K 3/02335; H03K 3/02; H03K 3/021; H03K 3/023

See application file for complete search history.

(56) References Cited

U.S. PATENT DOCUMENTS

| | | | | |
|---|---|---|---|---|
| 5,986,487 | A * | 11/1999 | Ridgers | H03K 17/667 327/157 |
| 6,050,945 | A * | 4/2000 | Peterson | B06B 1/0215 600/443 |
| 6,051,895 | A * | 4/2000 | Mercier | H03K 17/785 307/125 |
| 6,265,921 | B1 * | 7/2001 | Heinrich | H03K 4/06 327/134 |
| 6,347,029 | B1 * | 2/2002 | Ouyang | G05F 1/573 327/309 |
| 7,692,456 | B2 * | 4/2010 | Hanazawa | H03K 19/018521 327/108 |
| 8,004,339 | B2 * | 8/2011 | Barrow | H03K 19/018521 327/333 |
| 8,054,698 | B2 * | 11/2011 | De Sandre | G11C 13/0004 365/189.16 |
| 9,323,270 | B1 * | 4/2016 | Rossi | B06B 1/0215 |
| 10,886,856 | B2 * | 1/2021 | Yang | H02M 3/33592 |
| 2003/0169025 | A1 * | 9/2003 | Finney | H01L 29/7813 323/276 |
| 2005/0007711 | A1 * | 1/2005 | Liu | H02H 3/202 361/90 |
| 2006/0071639 | A1 * | 4/2006 | Ross | H02J 7/022 320/116 |
| 2007/0285074 | A1 | 12/2007 | Maekawa et al. | |
| 2008/0024099 | A1 * | 1/2008 | Oki | H02M 1/08 323/282 |
| 2008/0238382 | A1 * | 10/2008 | Wei | H02M 3/1588 323/271 |
| 2010/0127678 | A1 * | 5/2010 | Inatomi | H02M 1/32 323/282 |
| 2010/0219892 | A1 | 9/2010 | De Cremoux | |
| 2012/0039007 | A1 * | 2/2012 | Turchi | H02M 3/1584 361/87 |
| 2012/0194162 | A1 * | 8/2012 | Lin | H02M 1/14 323/304 |
| 2015/0372678 | A1 | 12/2015 | Zhang et al. | |
| 2016/0087422 | A1 * | 3/2016 | Mourrier | H02H 7/0844 361/86 |
| 2016/0211848 | A1 * | 7/2016 | Hsu | H03K 19/017509 |
| 2016/0277012 | A1 * | 9/2016 | Abesingha | H03K 19/018514 |
| 2017/0012617 | A1 * | 1/2017 | Moctezuma | H02H 3/087 |
| 2018/0198442 | A1 * | 7/2018 | Hokazono | H03K 17/0828 |
| 2018/0248522 | A1 * | 8/2018 | Gambero | H03F 1/305 |
| 2018/0302080 | A1 | 10/2018 | Terenzi et al. | |
| 2019/0094079 | A1 * | 3/2019 | Elsayed | G05F 1/56 |
| 2019/0103809 | A1 * | 4/2019 | Yang | H02M 3/04 |
| 2019/0379288 | A1 * | 12/2019 | Chaput | H02M 3/1582 |

FOREIGN PATENT DOCUMENTS

| | | |
|---|---|---|
| CN | 101243370 A | 8/2008 |
| CN | 103715657 A | 4/2014 |
| CN | 208707287 U | 4/2019 |
| GB | 2 384 632 A | 7/2003 |
| JP | 4148243 B2 | 9/2008 |

OTHER PUBLICATIONS

Kuhn et al., "ESD Detection Circuit and Associated Metal Fuse Investigations in CMOS Processes," *IEEE Transactions on Device and Materials Reliability* 14(1): 146-153, Mar. 2014.

Sadik et al., "Short-Circuit Protection Circuits for Silicon-Carbide Power Transistors," *IEEE Transactions on Industrial Electronics* 63(4): 1995-2004, Apr. 2016.

* cited by examiner

HIGH VOLTAGE DRIVING ELECTRONIC CIRCUIT ARRANGEMENT HAVING A SHORT CIRCUIT PROTECTION, CORRESPONDING APPARATUS AND METHOD

BACKGROUND

Technical Field

The description relates to electronic circuit devices or arrangements.

One or more embodiments relate to devices that can be used, for example, in ultrasound transmission channels.

One or more embodiments can be applied, for example, in echographic apparatuses.

Description of the Related Art

In the medical field, apparatuses and systems are known, such as echographic systems, which can provide for the presence of an ultrasound channel having the task of electrically stimulating a transducer (for example an ultrasound generator, of piezoelectric material or of capacitive type) connected to its output during a transmit phase. Conversely, during a receive phase, the channel receives from the transducer the echo of the transmitted wave, transferring it to the signal processing and reception circuitry.

These ultrasound channels are typically obtained by means of electronic devices or electronic circuit arrangements operating in the field of high voltages (HV: High Voltage), and which are subject to short circuit events which can be very damaging. For example, it is possible to define a high voltage circuit as a circuit which uses voltages greater than those used as power supplies for low voltage signals, where these power supply voltages for low voltage signals are, in commonly known technologies, approximately 1 V to 5 V.

These short circuit events in high voltage transmission devices, such as pulsers, or pulse generators, and linear operational amplifiers, are mainly due to:
  internal damage in the silicon;
  low load resistances;
  high load capacitances.

In general, protection against short circuits is known to be employed in ultrasound applications which make use of real time circuit protection. This type of solution makes use of resistors or fuses in series with the high voltage power supply in order to detect the short circuit.

This type of protection, while on the one hand providing a very rapid protection, on the other hand exhibits marked drawbacks in terms of power dissipation and a reduction in performance levels.

Over the years, there has been quite extensive research and innovation activity in this technological sector, as confirmed by documents such as, for example, Kuhn, William; Eatinger, Ryan; Melton, Steven, *"ESD Detection Circuit and Associated Metal Fuse Investigations in CMOS Processes"* IEEE Transactions on Device and Materials Reliability, pp. 146-153, March, 2014 and V. John; Bum-Seok Suh; T. A. Lipo, *"Fast clamped short circuit protection of IGBTs"* Applied Power Electronics Conference and Exposition, 1998. APEC '98. Conference Proceedings 1998, Thirteenth Annual. These solutions are, however, also in general affected at least by power dissipation problems.

BRIEF SUMMARY

In view of this extensive activity, the demand for improved solutions, for example in relation to power dissipation, is still felt.

An aim of one or more embodiments is to contribute towards meeting this demand.

According to one or more embodiments, this aim can be achieved by virtue of a driving circuit arrangement having the characteristics referred to in the claims that follow.

One or more embodiments can relate to a corresponding apparatus (for example, an echographic apparatus) as well as a corresponding method.

The claims form an integral part of the technical teachings imparted here in relation to one or more embodiments.

One or more embodiments can provide one or more of the following advantages:
  low power dissipation;
  operation at low voltage and power;
  small area occupied on the chip;
  no continuous consumption of power;
  possibility of programming a blank interval;
  possibility of operating with both linear and square wave high voltage signals.

BRIEF DESCRIPTION OF THE SEVERAL VIEWS OF THE DRAWINGS

One or more embodiments will now be described, purely by way of non-limiting example, with reference to the accompanying figures, in which.

DETAILED DESCRIPTION

In the description that follows, various specific details are illustrated with the aim of providing an in-depth understanding of various example embodiments in the description. The embodiments can be obtained without one or more of the specific details, or using other methods, components, materials, etc. In other cases, known structures, materials or operations are not illustrated or described in detail such that the various aspects of the embodiments will be made clear. Reference to "one embodiment" within the framework of the present description is intended to indicate that a particular configuration, structure or characteristic described in relation to the embodiment is included in at least one embodiment. Therefore, phrases like "in one embodiment" which may be present at various points in the present description do not necessarily refer precisely to the same embodiment.

Furthermore, particular shapes, structures or characteristics can be combined in any suitable manner in one or more embodiments.

The references used here are provided solely for convenience and therefore do not define the scope of protection or the importance of the embodiments.

Figure 1:
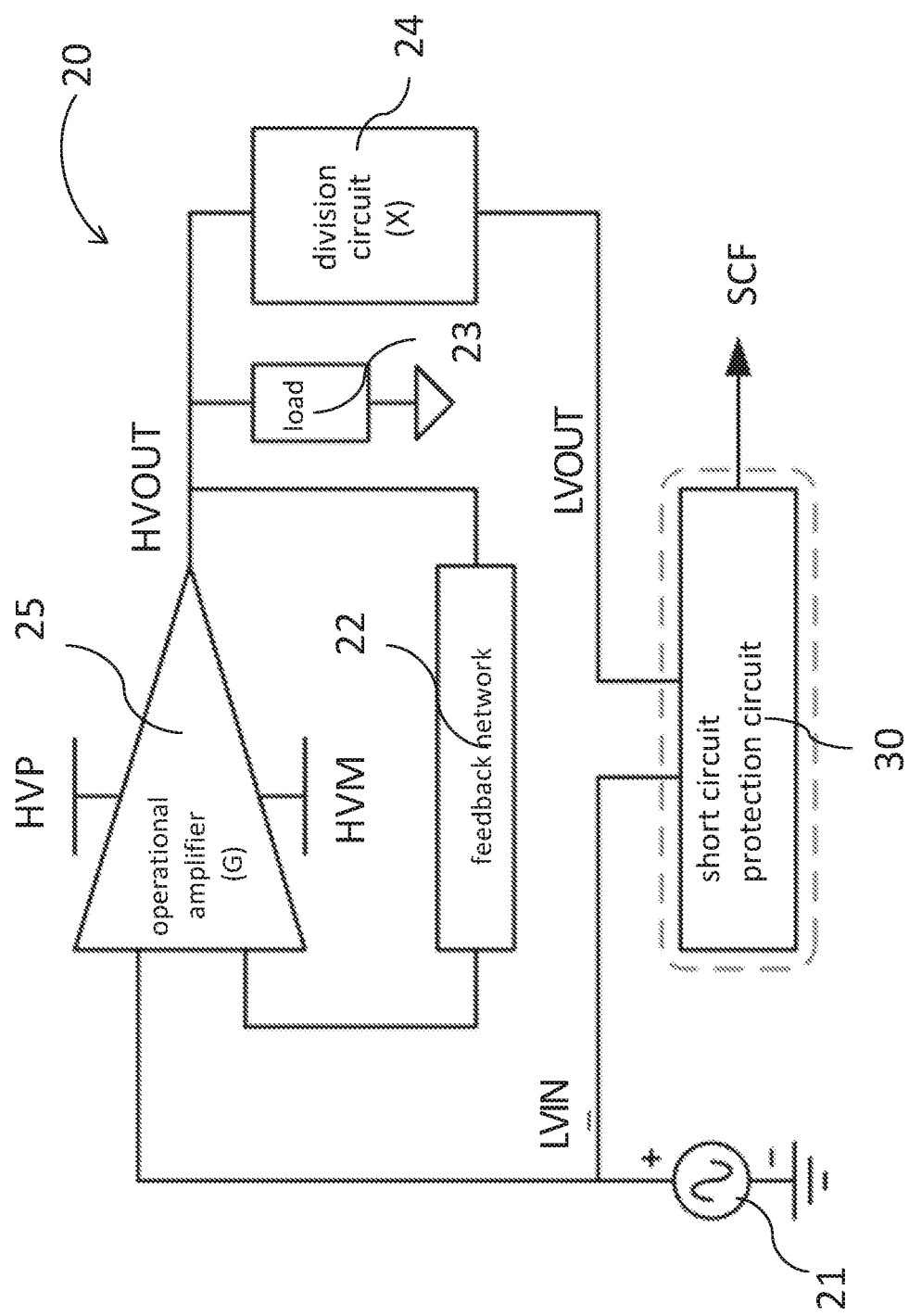
FIG. 1 is a circuit diagram of a first embodiment of a driving circuit device described herein.

FIG. 1 represents a first embodiment of a high voltage driving circuit arrangement 20 for driving a load, indicated with the reference numeral 23, the arrangement configured to receive a low voltage input signal, in this case the signal LVIN, and to generate a high voltage output signal HVOUT at the output, which is obtained mainly through an operational amplifier 25 operating at high voltage. This first embodiment of a high voltage driving circuit arrangement 20 can operate as transmission driver in an ultrasound channel, for example in an echographic apparatus. This operational amplifier 25 operating at high voltage is connected between a positive high voltage HVP and a negative high voltage HVM and applies a gain factor G to a sinusoidal input low voltage LVIN, of symmetric type with respect to a ground voltage reference GND, and applied by means of a low voltage signal generator 21. The reference 22 indicates a feedback network of the high voltage operational amplifier 25. In general, for example, the positive high voltage HVP and the negative high voltage HVM have the values +100 V and −100 V respectively, and so the operational amplifier 25 operating at high voltage establishes a sinusoidal high voltage output signal HVOUT with a maximum peak-to-peak amplitude of 200 V. The sinusoidal input low voltage LVIN can have a peak-to-peak amplitude of 4 V, although other peak-to-peak values are clearly possible. Usually, the input low voltage LVIN has a maximum amplitude equal to the low voltage power supplies, i.e., between 1 V and 5 V.

At the output of the operational amplifier 25 operating at high voltage, between the output node of the amplifier 25 and ground GND, a load 23 is connected. At the output node of the amplifier 25, a division circuit 24 is also connected, for example a resistive network, which generates or draws a fraction corresponding to a division factor X of the high voltage output signal HVOUT as the low voltage output signal LVOUT. As can be observed, both the low voltage input signal LVIN and the low voltage output signal LVOUT are sent to respective inputs of a short circuit protection circuit 30 which supplies a short circuit presence signal SCF.

Figure 2:
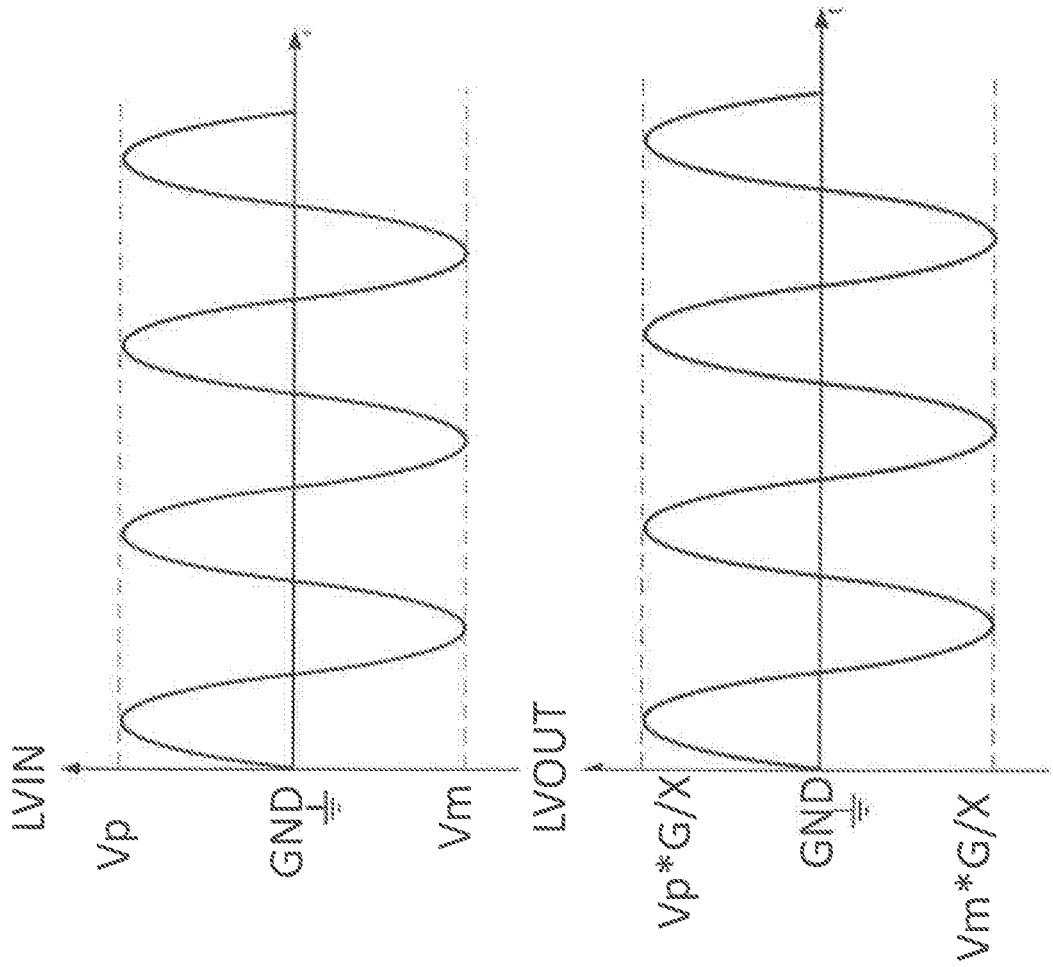
FIGS. 2A and 2B are timing diagrams of input and output signals of the driving circuit device of FIG. 1.

In FIG. 2A, there is represented a diagram which shows how the low voltage input signal LVIN, a voltage as a function of time, varies as a function of time t. It is a sinusoidal signal with a frequency $f_{in}$, and with an amplitude that varies between a positive voltage value Vp and a negative voltage value Vm, for example +2 V and −2 V. FIG. 2B, on the other hand, shows how the low voltage output signal LVOUT, which is a sinusoid of corresponding frequency $f_{in}$ and which has an amplitude between a positive voltage Vp*G/X, i.e., the positive voltage value Vp of the low voltage input voltage LVIN multiplied by the gain G of the amplifier 25 and divided by the division factor X, and a negative voltage Vm*G/X, i.e., the negative voltage value Vm of the low voltage input voltage LVIN multiplied by the gain G of the amplifier 25 and divided by the division factor X. Preferably, the division factor X is substantially equal to the gain value G, although in variant embodiments a division factor value X that is different from the gain G can be used. If the division factor X is different from the gain G, a gain A of the gain stage 31 shown hereinafter can be modified, to make the two voltages compared by the short circuit protection circuit 30 comparable.

Figure 3:
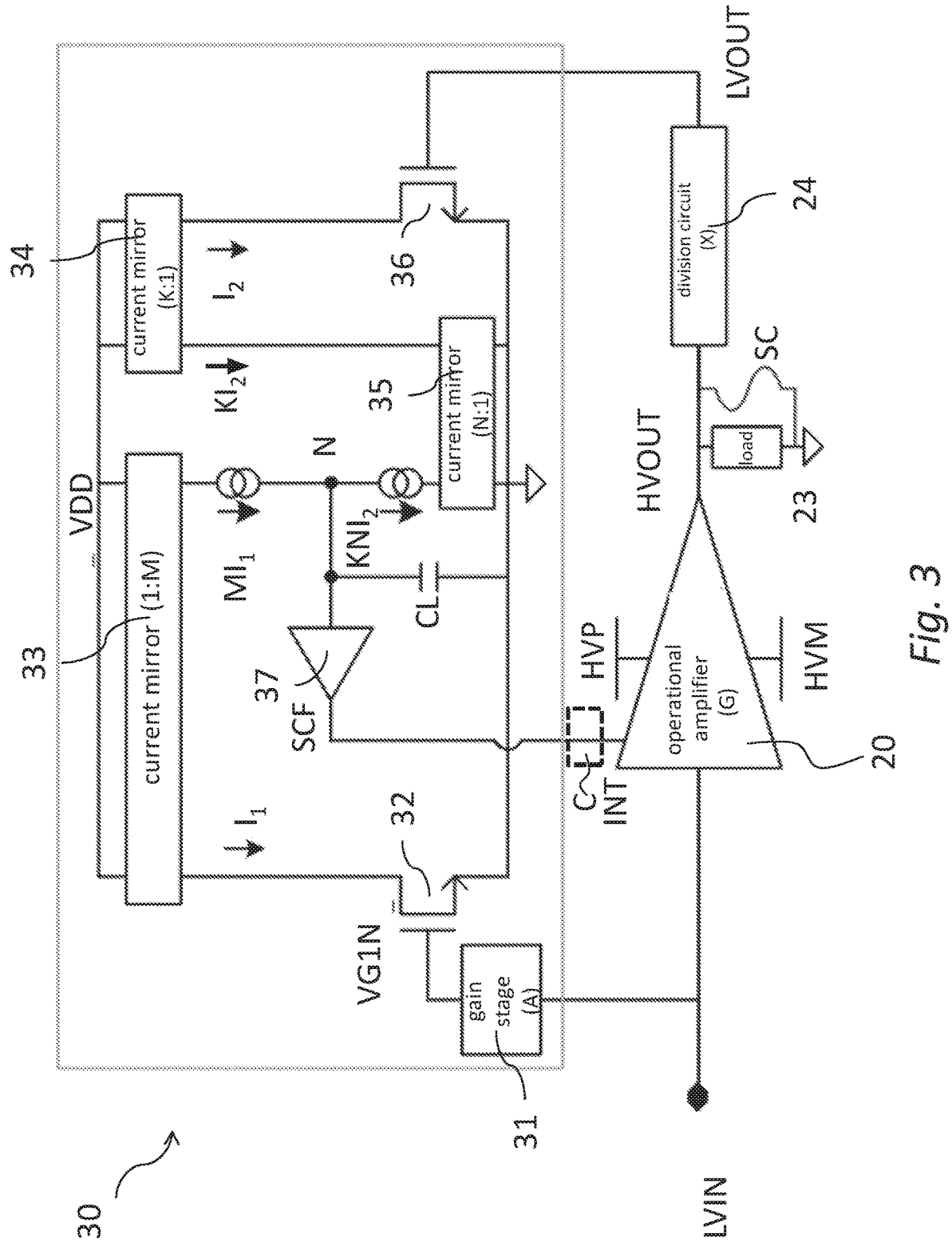
FIG. 3 is a circuit diagram of the protection circuit used by the first embodiment of the driving circuit device of FIG. 1, FIGS. 4A, 4B and 4C are timing diagrams of quantities used by the protection circuit of FIG. 3 operating with the first embodiment of the driving circuit of FIG. 1.

FIG. 3 shows in greater detail the short circuit protection circuit 30, which receives the low voltage input signal LVIN at the input of an associated gain stage 31, which can be for example obtained by means of an operational amplifier, which applies a gain A to the low voltage input signal LVIN and establishes at its output an input gate signal VG1N, therefore VG1N=A*LVIN. This input gate signal VG1N controls the control input of an electronic switch 32, in particular the gate electrode of an input MOSFET 32, which operates as a switch. The source electrode of the input MOSFET 32 is connected to ground GND, while the drain electrode is connected to a first current mirror 33, with a mirror factor M between:

an input current $I_1$, which flows through the branch connected to the input MOSFET 32, from a voltage VDD present at a digital power supply terminal, for example a low voltage of 3.3 V to which the remaining electrodes of the first current mirror 33 are connected, to ground GND when the MOSFET 32 is closed, and a pull-up current $M*I_1$, which flows through the other branch of the current mirror 33, and flows into a control node N.

The output of the division circuit 24 at which the output low voltage LVOUT is drawn, is connected directly to an output switch 36, in particular to the gate electrode of an output MOSFET transistor 36, which is similar in characteristics to the input MOSFET 32, having for example the same threshold Vs to become conducting, and having the source electrode connected to ground GND. The drain electrode of the output MOSFET 36 is connected to a second current mirror 34, which mirrors an output current $I_2$ which flows from the terminal where the digital power supply voltage VDD is present, to which the second current mirror 34 is also connected, to ground GND, through the output MOSFET 36 when it is closed. The second current mirror 34 has a mirror ratio K and draws a current $K*I_2$ from a third current mirror 35, with mirror ratio N and connected to ground GND. The other branch of the current mirror 35 is connected to the control node N, and so draws from said control node N a pull-down current $K*N*I_2$.

Between the control node N and ground GND, there is connected a control capacitor CL, while the control node N is also connected to the input of a threshold comparator 37, for example obtained by means of an operational amplifier, with a voltage threshold Vth, beyond which, as is known, the logic value of its output changes. The threshold comparator 37 is also of the type which implements a high impedance at its input. The control capacitor CL substantially represents a capacitive load which the pull-up and pull-down currents must drive to bring about the switching of the comparator 37.

There is also shown in FIG. 3, in parallel with the load 23, a possible short circuit SC between the output node of the amplifier 25 and ground GND, which can be present when a short circuit event occurs. If a short circuit event does not occur, the short circuit SC is absent and there is an output voltage LVOUT downstream of the division circuit 24. If a short circuit event occurs, the short circuit SC instead establishes a very low voltage value at the input of the division circuit 24, which is indicated as short circuit output voltage LVOUT(SC), although it is nevertheless still the voltage that is formed at the output of the division circuit 24 which controls the gate of the MOSFET 36.

Figures 4A, 4B, 4C:
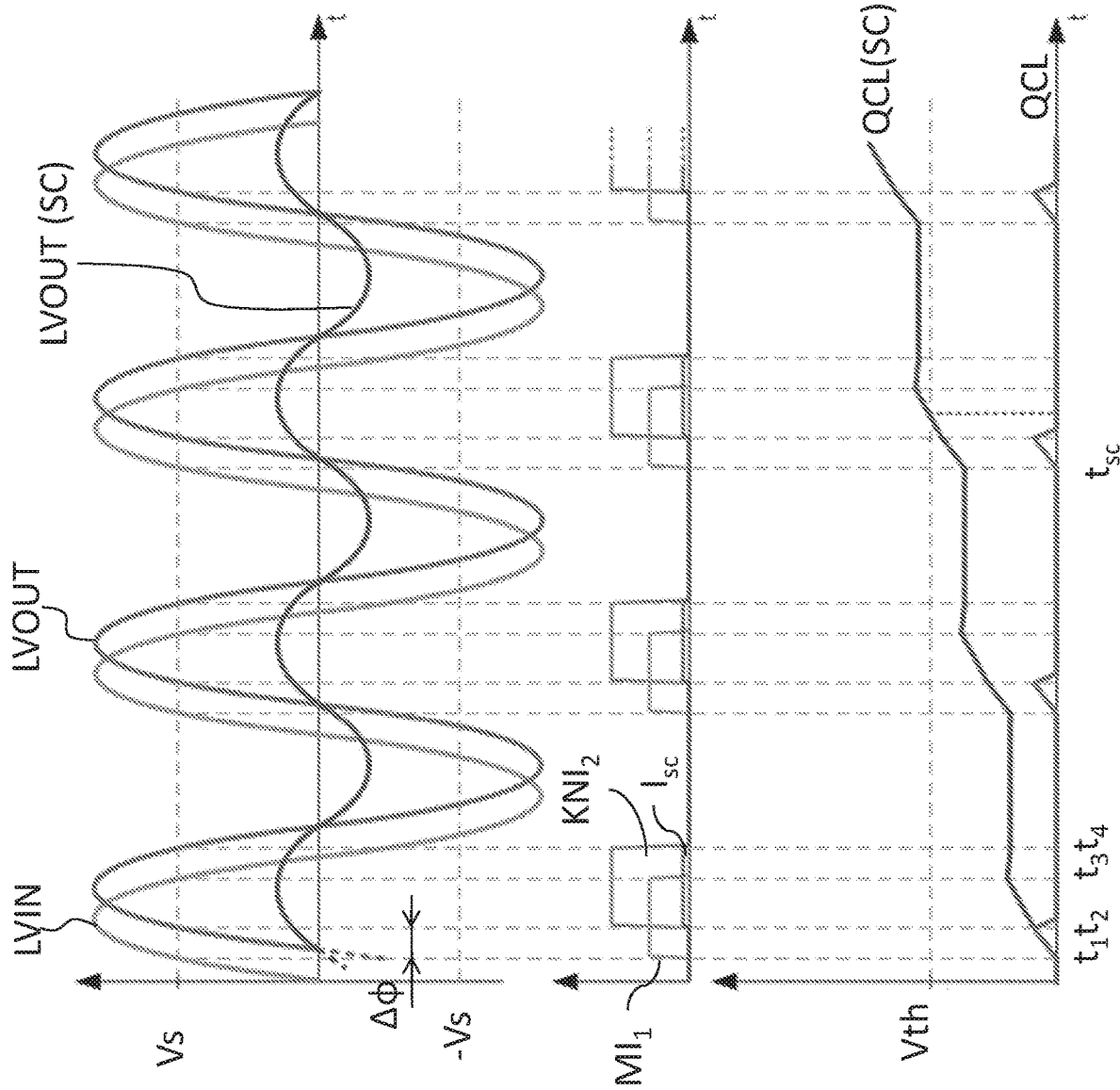

FIG. 4A shows how the input voltage LVIN, the output voltage LVOUT and the output voltage in the case of a short circuit LVOUT(SC) respectively vary as a function of time t. As can be noted, firstly, the input voltage LVIN and the output voltage LVOUT are out of phase with one another, with a phase difference, or phase shift, $\Delta\varphi$, which in general is less than a half-period. Such a phase shift $\Delta\varphi$ generally occurs normally in the circuit arrangement 20 due to the presence of capacitive or inductive elements. If the phase shift $\Delta\varphi$ is not present or is negligible, i.e., not sufficient to ensure operation of the solution described here, in variant embodiments provision is made to insert a phase shift $\Delta\varphi$ of the order of that represented in the figures by means of one or more components or modules which establish such a phase shift, for example directly inside the gain stage 31. Moreover, in FIG. 4A, the output voltage LVOUT has, through the dimensioning of the division factor X with respect to the gain G, for example X=G, substantially the same amplitude as the input voltage LVIN. FIG. 4A also shows a value corresponding to the switching threshold, Vs, of the switches 32, 36. If the voltage VG1N or LVOUT on their control electrode becomes greater than the threshold Vs, these switches close, i.e., the corresponding MOSFETs become conducting. Conversely, when the voltage VG1N or LVOUT on their control electrode becomes less than the threshold Vs, these switches open, i.e., they are substantially open circuits. The output voltage in the case of a short circuit LVOUT(SC) has a frequency and phase corresponding to that of the output voltage LVOUT, but, as has been mentioned, a much lower amplitude due to the short circuit SC between the output of the amplifier 25 and ground GND. In general, this amplitude could also be substantially zero, its value dependent on the short circuit impedance which has been created. If the short circuit impedance is very low, the voltage can be substantially zero or negligible.

On a time axis aligned in time with and corresponding to that of FIG. 4A, FIG. 4B shows the currents which flow into the control capacitor CL through the control node N. Dotted lines indicate the time instants, respectively $t_1$, $t_2$, $t_3$, $t_4$, at which the input voltage LVIN and the output voltage LVOUT cross the voltage threshold Vth, either in the rising or falling direction.

On a time axis corresponding to that of FIG. 4A and FIG. 4B, FIG. 4C shows how the charge in the control capacitor CL varies, i.e., a charge QCL in the capacitor CL without a short circuit and a charge QCL(SC) in the capacitor CL in the case of a short circuit, these variations being determined by the currents which flow into the control capacitor CL through the control node N, i.e., by the pull-up current $M*I_1$ and by the pull-down current $K*N*I_2$.

Therefore, with reference to these FIGS. 4A, 4B and 4C, the operation of the short circuit protection circuit 30 takes place in the following way.

In the absence of a short circuit SC, the input low voltage LVIN, which is in phase lead by an amount equal to the phase shift $\Delta y$, with respect to the output voltage LVOUT, generally crosses beforehand, at an instant $t_1$, the switching threshold Vs of the input MOSFET 32, which preferably is the same for the output MOSFET 36. This brings about the closure of the input MOSFET 32 and the flow of a pull-up current $M*I_1$ entirely into the control node N, considering that the comparator 37 exhibits a high impedance input, which charges the control capacitor CL, until, at an instant $t_3$, the input low voltage LVIN falls below the switching threshold Vs again, bringing about the opening of the input MOSFET 32 and the interruption to the flow of the pull-up current $M*I_1$ into the control node N. At the instant $t_2$, before the instant $t_3$, after a temporal phase shift $t_1$-$t_2$ which is the phase shift $\Delta\varphi$ caused by the circuit characteristics of the arrangement 20, the output low voltage LVOUT crosses the switching voltage Vs and places the output MOSFET 36 in conduction. It is deduced from this that, through the combined action of the second and third current mirrors, 34 and 35, the pull-down current $K*N*I_2$ is drawn from the control node N, discharging the control capacitor CL, up to the instant $t_4$ when the output low voltage LVOUT falls below the switching threshold Vs again, bringing about the opening of the output MOSFET 36. In FIG. 4C, this is clear from how the charge QCL varies in the absence of a short circuit, which between the instant $t_1$ and the instant $t_2$ rises through the effect of the pull-up current $M*I_1$ and then sharply falls when the pull-down current $K*N*I_2$, which is by design greater than the pull-up current $M*I_1$, by means of the dimensioning of the mirror ratios M, K, N, for example $K*N>M$ can be chosen, rapidly discharges the control capacitor CL up to the time instant $t_2$ and even more rapidly up to the time instant $t_3$, when the pull-up current $M*I_1$ is no longer present. In the case of a short circuit however, as seen in FIG. 4A, the output low voltage LVOUT(SC) has insufficient amplitude to cross the switching voltage Vs of the output MOSFET 36. It is deduced from this that the pull-down current $K*N*I_2$ is never activated, and therefore at each cycle of the input voltage LVIN the control capacitor CL is charged over the interval $t_1$-$t_3$, then remains constant, and at the next cycle or period of the sinusoidal signal it is charged again over the corresponding interval $t_1$-$t_3$ of this cycle by the pull-up current $M*I_1$. As is seen in the example of FIG. 4C, at the third cycle, at a detection instant $t_{sc}$, the charge QCL(SC) establishes a voltage drop value across the capacitor CL which crosses the threshold voltage Vth (note that for simplicity in FIG. 4C, the charge is indicated, but to compare it with the threshold voltage, its value is actually multiplied by the nominal capacitance value of the capacitor CL) of the threshold comparator 37. In this case, the comparator 37 provides for switching the logic value of its output, which corresponds to the short circuit presence signal SCF, which in this case is therefore substantially a flag type logic signal, for example logic one indicates the detection of a short circuit SC. On the basis of this short circuit presence signal SCF, the amplifier 25 or a control circuit thereof operates the switching-off or disabling of the amplifier 25 itself. In general, the short circuit presence signal SCF can be received by a processor C which controls the operation of the amplifier 25 according to the needs of the apparatus in which it operates, for example an echographic apparatus in which the processor C manages the amplifier 25 as a high voltage driver of a load represented by a piezoelectric device to implement an ultrasound transmission channel. Since, in such an apparatus, the amplifier 25 is active during transmit phases, but is inactive during receive phases, provision is made for such a processor C to activate or deactivate the amplifier 25 according to the transmit or receive phase. This processor C therefore can also be configured to send, following the reception of a short circuit presence signal SCF which indicates the presence of the short circuit SC, a command INT for disabling the amplifier 25.

Figure 5:
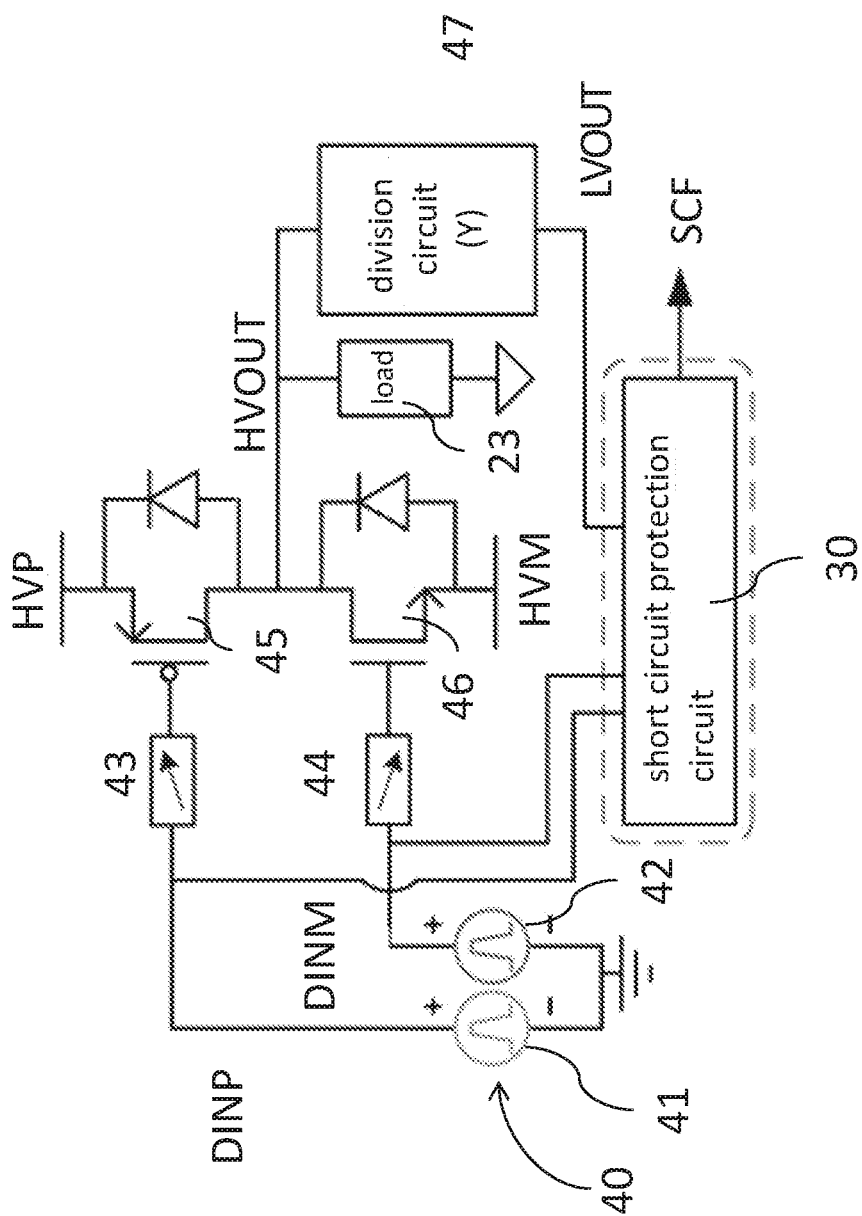
FIG. 5 is a circuit diagram of a second embodiment of a driving circuit device described herein.

In FIG. 5, a variant embodiment of the high voltage driving circuit arrangement for driving a load is described, the arrangement being configured to receive a low voltage input signal, in this case a pair of square wave digital input signals DINP and DINM, and to generate a high voltage output signal HVOUT at the output, obtained mainly through a pulser or pulse generator circuit, 40. In particular, this pulser 40 comprises generators 41 and 42 of square wave signals DINP and DINM respectively, complementary with one another, which vary between the ground voltage GND, preferably 0 V, and the digital power supply voltage VDD, for example 3.3 V, which is a typical power supply value for low voltage signals. The square wave signals DINP and DINM are respectively sent to a level translator circuit, or level shifter, 43, which raises the positive square wave signal DINP to the positive high voltage level HVP, while a level shifter 44 brings the negative square wave signal DINM to the negative high voltage level HVM. The outputs of the level shifters 43 and 44 control the inputs of pMOS and nMOS transistors 45 and 46 respectively, which substantially implement a pulser, connected between the positive high voltage HVP and the negative high voltage HVM, the high voltage output HVOUT of which is connected to the load 23. The protection circuit 30, in a manner similar to that shown in FIG. 1, is connected to the output node of the pulser 40 and to the load 23 via a division circuit 47 which divides the high voltage output signal HVOUT by a factor Y, obtaining the output low voltage LVOUT supplied to the input of the protection circuit 30, in particular to the gate of the output MOSFET 36. The input of the protection circuit 30 connected to the input MOSFET 32 (FIG. 3) is on the other hand connected to the positive square wave signal DINP.

It is noted that in FIG. 5, compared with FIG. 3 which represents an example of detecting and comparing only the positive front on the sinusoidal wave, both the square wave digital input signals DINP and DINM, which enter the protection circuit 30, are shown, since this protection circuit 30 in variant embodiments can comprise a dual circuit to compare the negative front of the output wave LVOUT with the negative signal DINM. A dual circuit at the block 30 can be inserted to also monitor the negative front; in which case the signal LVIN for the amplifier and the signal DINM for the pulser would be used as input.

Therefore, the high voltage driving circuit arrangement 40 is in general configured to receive a low voltage input signal which is a square wave signal, particularly a signal comprising two complementary square wave signals DINP, DINM, which is used to operate the first electronic switch, in particular by using one of the two complementary square wave signals, in the example the positive signal DINP but if necessary also the negative signal DINM.

The protection circuit 30 associated with the circuit of FIG. 5 is not however represented here in detail, but with reference to the diagram of FIG. 3, the protection circuit 30 receives from the circuit arrangement having a pulser circuit 40 as inputs the signal DINP towards the input switch 32 and the output signal LVOUT towards the output switch 36, and similarly supplies the short circuit presence signal SCF which indicates the presence of the short circuit SC directly to the circuit arrangement 40 or to a processor C which as a result sends a command INT to disable the pulser 40. As discussed hereafter, the mirror ratio values M, K, N and other parameters can be different according to the characteristics, for example related to the phase shift, the pulser 40 and the type of response desired to be obtained from the protection circuit 30. In general, the pulser 40 exhibits a smaller phase shift, but even in that case it is possible to bring about an additional delay in the block 31 to the digital signal DINP, as in the case of the linear amplifier.

Figure 6A:
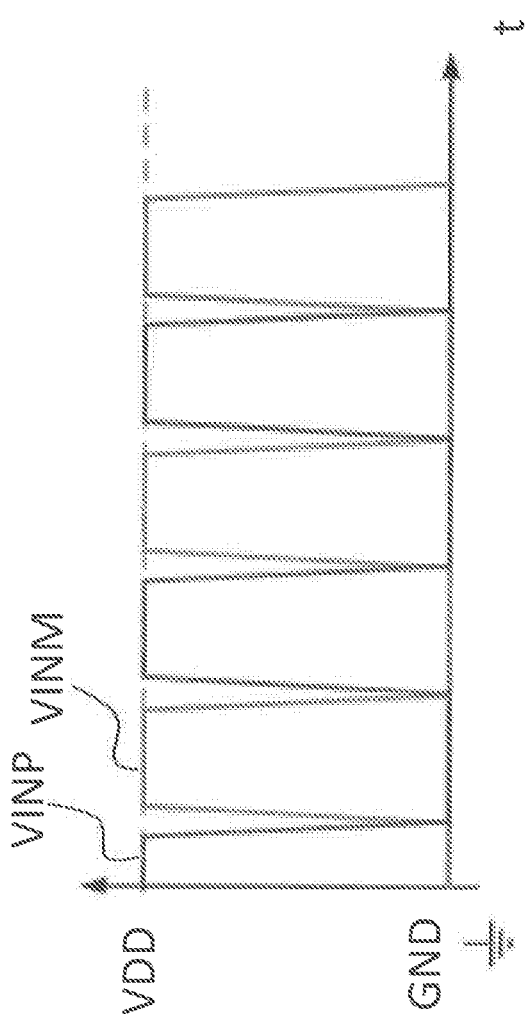
FIGS. 6A and 6B are timing diagrams of input and output signals of the driving circuit device of FIG. 5.
Figure 6B:
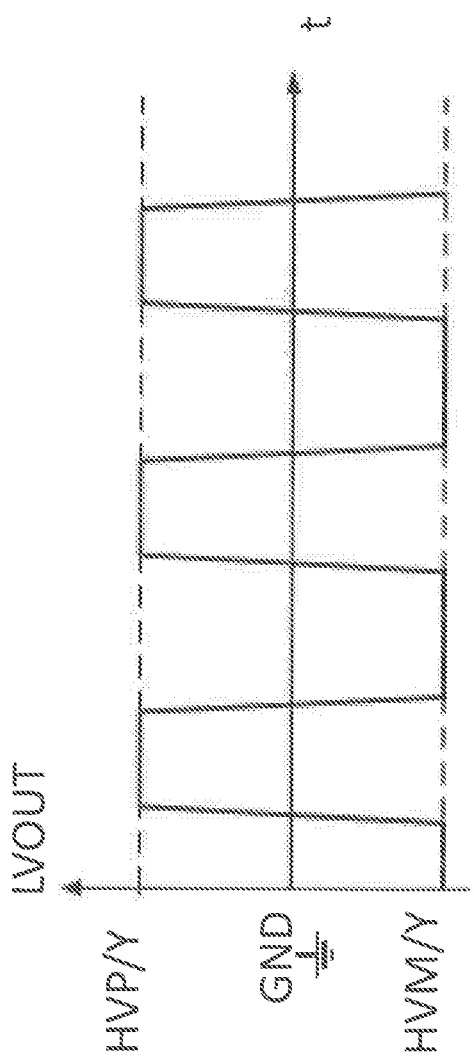

FIG. 6A represents a diagram which shows how the complementary positive DINP and negative DINM square wave signals of frequency $f_{in}$ vary as a function of time t, between the ground voltage GND, preferably 0 V, and the digital power supply voltage VDD, for example 3.3 V. FIG. 6B on the other hand shows the variation of the low voltage output signal LVOUT, which is a square wave of corresponding frequency $f_{in}$ which oscillates between a positive voltage HVP/Y, i.e., the positive high voltage value HVP divided by the division factor Y, and a negative voltage HVM/Y, i.e., the negative high voltage value HVM divided by the division factor Y. Preferably, the division factor Y is dimensioned so as to establish a low voltage output signal LVOUT with voltage amplitude equal to the digital power supply voltage VDD.

Figures 7A, 7B, 7C:
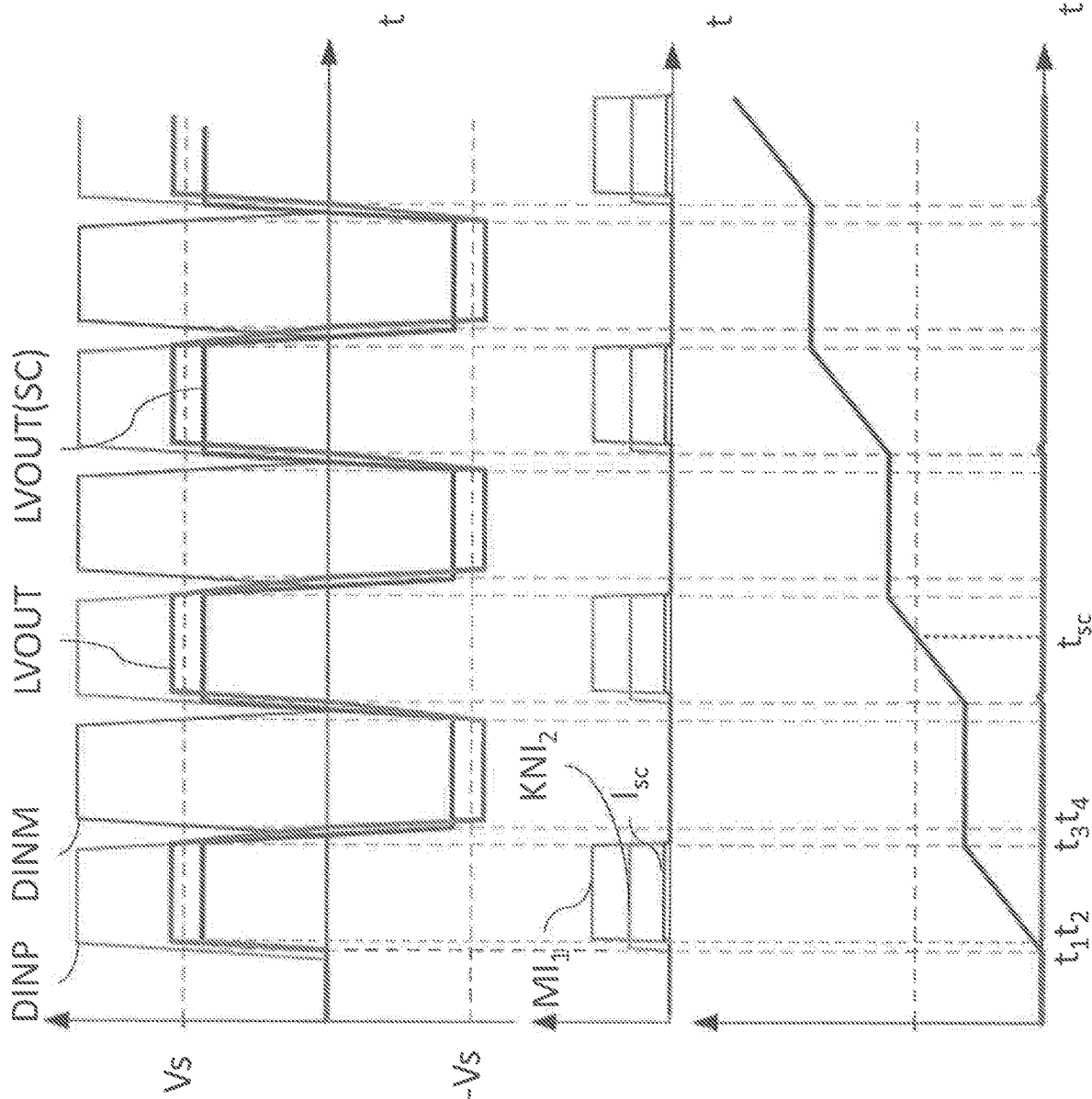
FIGS. 7A, 7B and 7C are timing diagrams of quantities used by the protection circuit of FIG. 3 operating with the second embodiment of FIG. 5.

In FIGS. 7A, 7B and 7C, which show the voltage, current and charge quantities for the pulser circuit 40, which are similar to those of the amplifier 25 of FIGS. 4A, 4B and 4C, the variation over time (FIG. 7A) of the positive DINP and negative DINM square wave signals, which form the input signal, similar to the voltage LVIN, of the protection circuit 30, and the output low voltage LVOUT, phase-shifted by a time $t_1$-$t_2$, can be observed. Likewise, an output low voltage LVOUT(SC) in the presence of a short circuit SC, of lower amplitude, in particular lower than the switching threshold Vs, is indicated. The operation is similar, although in this case the values of the instants $t_1$ and $t_2$ when the threshold Vs is crossed in the rising direction establish a greater overlap between the pull-up current M*$I_1$ and the pull-down current K*N*$I_2$, which indicates that in the absence of a short circuit, the charge QCL increases by a small amount, since it is almost always equal to the difference between the pull-up current M*$I_1$ and the pull-down current K*N*$I_2$ (in this example K*N*$I_2$>M*$I_1$), and is then discharged rapidly. In this case, it is possible to dimension, using the mirror ratios, the pull-down current K*N*$I_2$ as the higher value, since in the absence of a short circuit, the output signal LVOUT must remove all the charge stored in the control capacitance by the pull-up current M*$I_1$. In the presence of a short circuit SC however, the corresponding output signal LVOUT(SC) does not succeed in reaching the switching threshold Vs of the switch 36 and the pull-down current K*N*$I_2$ turns out to be negligible, and therefore charge is not drawn from the control capacitor CL. Thus, the instant $t_{sc}$ for detecting the short circuit SC can arise sooner (in FIG. 7C at the second cycle of the input square wave DINP), since the higher pull-up current carries the charge QCL(SC) more rapidly above the threshold in the presence of a short circuit, when there is no longer a pull-down current to discharge the control capacitor CL.

As already touched upon, a possible application context of the embodiments 20 or 40 of the driving circuit arrangement can relate to driving at high voltage a load represented by an active element comprising a piezoelectric transducer (PMUT) or a capacitive one (for example, CMUT: Capacitive Micromachined Ultrasonic Transducer) in a probe in an ultrasound channel contained in an apparatus such as an echographic system that can be used for example in the medical field. Reference to this possible application is not however to be understood in a limiting sense of the embodiments, which are also capable of being used for example in high voltage driving circuit arrangements in ultrasonic apparatuses of various types such as for example apparatuses for the analysis/inspection of materials, and even in apparatuses which require only high voltage driving. In the case of an echographic system, the probe can be intended to apply an ultrasonic signal to the body of a patient subjected to an echographic examination and if necessary to receive a corresponding echo signal.

Since in this apparatus the high voltage driving circuit arrangement described here is active in the transmit phases of the ultrasonic signal, but in the receive phases of the echo signal it is inactive, as indicated in the apparatus a processing device can be included to activate or deactivate the driving circuit arrangement 20 or 40 according to the transmit or receive phase. As mentioned, this processor can also be configured to send, following the reception of a short circuit presence signal SCF which indicates the presence of the short circuit SC, a command INT for disabling the amplifier 25.

In general, the high voltage driver for the ultrasound transmission channel can be obtained by means of the amplifier 25 or the pulser 40, which are described above, or even by using both of them in the same transmission channel, equipped with the protection circuit 30 described here. Consideration can also be given to having a single protection circuit 30 which monitors both circuits 20 and 40, since they are usually not used simultaneously in ultrasound applications. According to which of the two transmission devices is used, the protection circuit 30 is configured, if necessary under the control of the processor C, to draw the input signals LVIN or DINP (DINM) and the output signal of the circuit 20 or 40 used, in order to compare the correct signals to detect the short circuit.

From what has been described, it is clear that the characteristics and the performance of the protection circuit described can be adapted for each different pulser or linear operational amplifier by varying one or more of the following configuration parameters:

the mirror ratio M, N, K of one or more of the current mirrors 33, 34, 35;
the capacitance value of the control capacitor CL;
the frequency of the signal $f_{in}$;
the threshold voltage Vth of the comparator 37;
the gain A of the input stage 31. Such a stage 31 is present even in the case of the pulser 40, for example for the case in which the input signal DINP has a voltage range that is different from the power supply voltage VDD. In that case, the gain A is used to normalize the voltage of the positive square wave input signal DINP with the power supply voltage VDD;
the division factor X or Y.

The circuit described provides:
operation at low voltage and power;
small area occupied on the chip;
no continuous consumption of power;
possibility of operating with both linear and square wave high voltage signals, and with both linear amplifiers and pulsers.
possibility of programming a blank interval, i.e., a time interval before transmission at the detection instant $t_{sc}$ of the short circuit detection signal. The blank interval at the input is significant mainly for the operational amplifier 25; in that case, if the amplitude of the input signal LVIN is low and does not reach the threshold voltage of the input switch 32, there is no verification of the short circuit, since the pull-up current M*$I_1$ is negligible. This is done because for a low input signal there is a corresponding output signal HVOUT which is also lower than an established target value below which it is possible for a short circuit check to not be required. With respect to the high voltage output, the blank instant is valid both for the pulser 40 and for the operational amplifier 25.

All these configuration parameters can be dimensioned according to the specifications of the project and at threshold values beyond which it is desired to detect a short circuit.

In variant embodiments, one or more of such configuration parameters can be modifiable during the operation of the driving circuit arrangement, for example under the control of a control module such as the processor C of FIG. 3. The means for varying these configuration parameters upon the command of control signals sent by a processor or microprocessor, such as the mirrored current value (by varying the factors M, K, N) and/or the value of the division factor or the gain of the input amplification stage 31 or the threshold values of the comparator or of the switches and/or the signal frequency and/or the control capacitance value, are known per se in the state of the art and are clear to a person skilled in the art.

Furthermore, the circuit described can recognize either static short circuits—where there is a very low resistance at the output, and the voltage output signal HVOUT is reduced by limiting the current of the driving circuit device, therefore it is possible for the output low voltage LVOUT to not reach the threshold of the output switch 36, and consequently the negligible pull-down current K*N*$I_2$ and the pull-up current M*$I_1$ charges the control capacitance CL—or cases of high capacitive loads at a given frequency f—in the case of a large load capacitance Cu, the equivalent impedance is Zu=1/(2πfCu), and therefore at a determined frequency of the signal, a large value of the capacitance Cu can produce an equivalent impedance that is so low as to bring the voltage LVOUT of the output switch 36 below threshold.

The underlying principles remaining the same, the details of construction and forms of embodiment may be varied, even significantly, with respect to those illustrated here purely by way of non-limiting example, without thereby departing from the scope of protection.

Such scope of protection is defined by the accompanying claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high-voltage driving circuit, comprising:
a short-circuit protection circuit configured to compare a low voltage input signal received by the high-voltage driving circuit to a high voltage output signal generated by the high-voltage driving circuit, the short-circuit protection circuit including:
a threshold comparator including an input and an output, the input being coupled to a control node;
a capacitive element coupled to the input of the threshold comparator;
a first electronic switch controlled by the low voltage input signal and configured to cause a first pull-up current to be provided to charge the capacitive element;
a second electronic switch controlled by a low voltage output signal obtained by a voltage division of the high voltage output signal, the second electronic switch being configured to cause a second pull-down current to be provided to discharge said capacitive element; and
a division circuit having an input coupled to receive the high voltage output signal generated by the high-voltage driving circuit and having an output coupled to the second electronic switch, the division circuit being configured to generate the low voltage output signal corresponding to the high voltage output signal divided by a division factor, wherein said threshold comparator is configured to generate a short-circuit detection signal on the output based upon a voltage generated on said capacitive element in response to the first pull-up and second pull-down currents, the high-voltage driving circuit being configured to be disabled in response to the short-circuit detection signal being activated.

2. The high-voltage driving circuit according to claim 1, wherein said first electronic switch is connected to enable operation of a first current mirror to provide said first pull-up current to charge said capacitive element and said second electronic switch is connected to enable operation of at least one second current mirror to provide said second pull-down current to discharge said capacitive element.

3. The high-voltage driving circuit according to claim 1, further comprising a control module that in operation, in response to said short-circuit detection signal being activated, is configured to generate a deactivation command that is provided to said high-voltage driving circuit.

4. The high-voltage driving circuit according to claim 1, wherein said high-voltage driving circuit further comprises a linear operational amplifier and said short-circuit protection circuit further comprises an amplification stage configured to receive said low voltage input signal that is a sinusoidal signal that controls said first electronic switch through the amplification stage.

5. The high-voltage driving circuit according to claim 1, comprising:
a pulse generator configured to generate a square wave signal and output the square wave signal as said low voltage input signal.

6. The high-voltage driving circuit of claim 5, comprising:
a complementary short-circuit protection circuit configured to receive a complementary square wave signal as a respective low voltage input signal of the complementary short-circuit protection circuit, wherein the pulse generator is configured to generate the complementary square wave signal.

7. The high-voltage driving circuit of claim 1, wherein each of the first and second electronic switches comprises a MOSFET.

8. An ultrasonic apparatus, comprising:
a high-voltage drive circuit having a transducer terminal configured to be coupled to an ultrasonic transducer device capable of converting an electric high voltage output signal on the transducer terminal into an ultrasonic transmission signal and to convert an ultrasonic reception signal into an electrical receiving signal on the transducer terminal, the high-voltage drive circuit configured to generate the high voltage output signal based on a low voltage input signal and the high-voltage drive circuit further configured to turn off in response to an active short circuit presence signal; and
a short-circuit protection circuit coupled to the high-voltage drive circuit and configured to generate the short circuit presence signal, the short-circuit protection circuit configured to compare the low voltage input signal to the high voltage output signal to detect a short circuit on the transducer terminal and configured to activate the short circuit presence signal in response to the comparison indicating a short circuit condition on the transducer terminal.

9. The ultrasonic apparatus of claim 8, wherein the short-circuit protection circuit comprises:
a capacitive element coupled to a control node;
a first circuit having an input coupled to receive the low voltage input signal and having an output coupled to the control node, the first circuit configured to supply a pull-up current to the control node to charge the capacitive element;
a second circuit having an input coupled to the transducer terminal and having an output coupled to the control node, the a second electronic circuit configured to provide a pull-down current to the control node to discharge the capacitive element, a control voltage being generated on the control node in response to the pull-up and pull-down currents; and
a comparison circuit coupled to the control node and configured to generate the short circuit presence signal, the comparison circuit configured to activate the short circuit presence signal in response to the control voltage reaching a threshold value.

10. The ultrasonic apparatus of claim 9, wherein the comparison circuit comprises a threshold comparator configured to drive the short circuit presence signal from a first voltage corresponding to first logic value to a second voltage corresponding to a second logic value in response to the control voltage reaching a voltage threshold value.

11. The ultrasonic apparatus of claim 9, wherein the first circuit comprises:
a first current mirror coupled to the control node to provide the pull-up current based upon a first input current; and
a first switch having a signal node coupled to the first current mirror and a control node coupled to receive the low voltage input signal, the first switch configured to generate the first input current based on the low voltage input signal.

12. The ultrasonic apparatus of claim 11, wherein the second circuit comprises:
a division circuit coupled to the transducer terminal and configured to divide the high voltage output signal to generate a low voltage output signal;
a second current mirror coupled to the control node to provide the pull-down current based upon a mirrored output current;
a third current mirror coupled to the second current mirror to provide the mirrored output current based upon an output current; and
a second switch having a signal node coupled to the third current mirror and a control node coupled to the division circuit and configured to generate the output current based on the low voltage output signal.

13. The ultrasonic apparatus of claim 12, wherein each of the first and second switches comprises a transistor.

14. The ultrasonic apparatus of claim 8, wherein the high-voltage drive circuit comprises an operational amplifier configured to amplify the low voltage input signal to generate the high voltage output signal, and configured to be disabled and enabled responsive to the short circuit presence signal.

15. The ultrasonic apparatus of claim 14, wherein the operational amplifier includes and input and an output and further comprises a feedback network coupled between the input and output of the operational amplifier.

16. A method, comprising:
sensing a voltage on an input node configured to receive a low voltage input signal;
generating a high voltage output signal on an output node based on the low voltage input signal;
comparing the low voltage input signal to the high voltage output signal;

generating a short circuit presence signal based on the comparing the low voltage input signal to the high voltage output signal; and disabling the generating the high voltage output signal based on the short circuit presence signal indicating a short circuit is present on the output node, wherein comparing the low voltage input signal to the high voltage output signal includes:

generating a charging current to charge a control node based on the low voltage input signal;

dividing the high voltage output signal to generate a low voltage output signal;

generating a discharging current to discharge the control node based on the low voltage output signal;

generating a control voltage on the control node based upon the charging and discharging currents; and detecting that the short circuit is present on the output node based upon the control voltage reaching a threshold value.

17. The method of claim 16, wherein generating the charging current comprises:

generating an input current based on the low voltage input signal; and generating the charging current based upon the input current.

18. The method of claim 17, wherein generating the discharging current comprises:

generating an output current based on the low voltage output signal;

generating a mirrored output current based on the output current; and generating the discharging current based on the mirrored output current.

* * * * *